United States Patent
Verhaverbeke et al.

(10) Patent No.: US 7,037,842 B2
(45) Date of Patent: May 2, 2006

(54) METHOD AND APPARATUS FOR DISSOLVING A GAS INTO A LIQUID FOR SINGLE WET WAFER PROCESSING

(75) Inventors: Steven Verhaverbeke, San Francisco, CA (US); J. Kelly Truman, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/637,725

(22) Filed: Aug. 7, 2003

(65) Prior Publication Data

US 2004/0029388 A1    Feb. 12, 2004

Related U.S. Application Data

(63) Continuation of application No. 09/891,829, filed on Jun. 25, 2001, now abandoned.

(60) Provisional application No. 60/214,058, filed on Jun. 26, 2000.

(51) Int. Cl.
*H01L 21/302* (2006.01)
*H01L 21/461* (2006.01)
(52) U.S. Cl. ............... 438/704; 438/727; 438/907
(58) Field of Classification Search ........ 438/503, 438/704, 711, 727, 907, 935
See application file for complete search history.

(56) References Cited

U.S. PATENT DOCUMENTS

| | | | |
|---|---|---|---|
| 4,076,507 A | | 2/1978 | Hauberg |
| 4,676,809 A | * | 6/1987 | Fjallstrom et al. ............. 96/209 |
| 5,112,775 A | * | 5/1992 | Iida et al. .................... 438/105 |
| 5,254,143 A | * | 10/1993 | Anazawa et al. ............... 95/46 |
| 5,395,482 A | * | 3/1995 | Onda et al. .................... 216/73 |
| 5,571,367 A | * | 11/1996 | Nakajima et al. ....... 156/345.15 |
| 5,762,749 A | * | 6/1998 | Suzuki et al. .......... 156/345.22 |
| 5,766,490 A | * | 6/1998 | Taylor et al. ................ 210/758 |
| 6,001,189 A | * | 12/1999 | Rolfson ........................ 134/10 |
| 6,094,940 A | * | 8/2000 | Fujiwara et al. .............. 65/17.4 |
| 6,123,765 A | * | 9/2000 | Sinha et al. .................. 117/84 |
| 6,325,081 B1 | | 12/2001 | Miki et al. |
| 6,460,522 B1 | | 10/2002 | Lorimer |

* cited by examiner

*Primary Examiner*—Phuc T. Dang
(74) *Attorney, Agent, or Firm*—Blakely Sokoloff Taylor & Zafman

(57) ABSTRACT

A method and apparatus for processing a wafer is described. According to the present invention a wafer is placed on a substrate support. A liquid is then fed through a conduit having an output opening over the wafer. A gas is dissolved in the liquid prior to the liquid reaching the output over the wafer by flowing a gas into the conduit through a venturi opening formed in the conduit. The liquid with dissolved gas is then fed through the opening and onto the wafer where it can be used to etch, clean, or rinse a wafer.

22 Claims, 2 Drawing Sheets

METHOD AND APPARATUS FOR DISSOLVING A GAS INTO A LIQUID FOR SINGLE WET WAFER PROCESSING

This application is a CON of Ser. No. 09/981,829 filed Jun. 25, 2001 (abandoned) which claims the benefit of provisional application Ser. No. 60/214,058 filed Jun. 26, 2000 entitled METHOD AND APPARATUS FOR DISSOLVING A GAS INTO A LIQUID FOR SINGLE WET WAFER PROCESSING.

BACKGROUND OF THE INVENTION

1. Field of the Invention

The present invention relates to the field of semiconductor processing and more specifically to a method and apparatus for dissolving a gas into a liquid used for cleaning, etching, or rinsing a wafer.

2. Discussion of Related Art

Wet etching and wet cleaning of silicon wafers is usually done by immersing the wafers into a liquid. This can also be done by spraying a liquid onto a wafer or batch of wafers. Wet wafer cleaning and etching is traditionally done in a batch mode where several (e.g., between 50–100) wafers are processed simultaneously. Because of the need a short cycle time in chip manufacturing, there is a need for fast single wafer processing. In wet processing the amount of dissolved gas in the liquid used for processing is very important for process results.

When performing wet etching operations, the amount of gas is very important for process results. At first there are the common reactive gases such as $O_2$, $O_3$, and $H_2$. On the other side there are the inert gases such as $N_2$, Ar, and He. Both the reactive gas content and inert gas content are important in wet processing. The reactive gas can react with the semiconductor wafer surface or with contaminants on the surface. The inert gases determine the amount of cavitation during a megasonic cleaning step and therefore influence the particle removal. It is very important to control the amount of both reactive gases and inert gases dissolved into liquids when using wet processing to treat semiconductor wafers. Sometimes it is assumed that all dissolved reactive gases are "bad" and therefore it is assumed that the concentration of $O_2$, $O_3$, and $H_2$ has to be reduced to the minimum level possible. However, the right amount or the absence of reactive gases is dependent on a particular process and there is not a general level of dissolved reactive gases that is adequate for every process step. Present methods for dissolving gases into liquids include membrane contactors, bubbling chambers, spraying methods and shower type methods. A problem with these methods and apparatuses, however, is that they are bulky and expensive. They are ideal for batch processing tools but are to large and to expensive for very small single wafer tools.

Thus, there is a need for a simple and inexpensive way for dissolving the correct amount of reactive and inert gases into etching, cleaning, and rinsing liquids.

SUMMARY OF THE INVENTION

A method and apparatus for processing a wafer is described. According to the present invention a wafer is placed on a substrate support. A liquid is then fed through a conduit having an output opening over the wafer. A gas is dissolved in the liquid prior to the liquid reaching the output over the wafer by flowing a gas into the conduit through a venturi opening formed in the conduit. The liquid with dissolved gas is then fed through the opening and onto the wafer where it can be used to etch, clean, or rinse a wafer.

DETAILED DESCRIPTION OF THE PRESENT INVENTION

The present invention is a method and apparatus for dissolving gases into a liquid in a wet processing apparatus. In the following description numerous specific details are set forth in order to provide a thorough understanding of the present invention. One of ordinary skill in the art will understand that these specific details are for illustrative purposes only and are not intended to limit the scope of the present invention. Additionally, in other instances, well-know processing techniques and equipment have not been set forth in particular detail in order to not unnecessarily obscure the present invention.

The present invention is a method and apparatus for dissolving reactive and/or inert gases into a liquid and then using the liquid for wet processing. The present invention utilizes a venturi to dissolve a gas or gases such as but not limited to $O_2$, $O_3$, $H_2$, $N_2$, Ar, and He into a processing liquid supply line of a wet processing apparatus. The use of a ventui is ideally situated for dissolving gases into a liquid in a single wafer wet processing apparatus 100 such as shown in FIG. 1a.

Figure 1A:
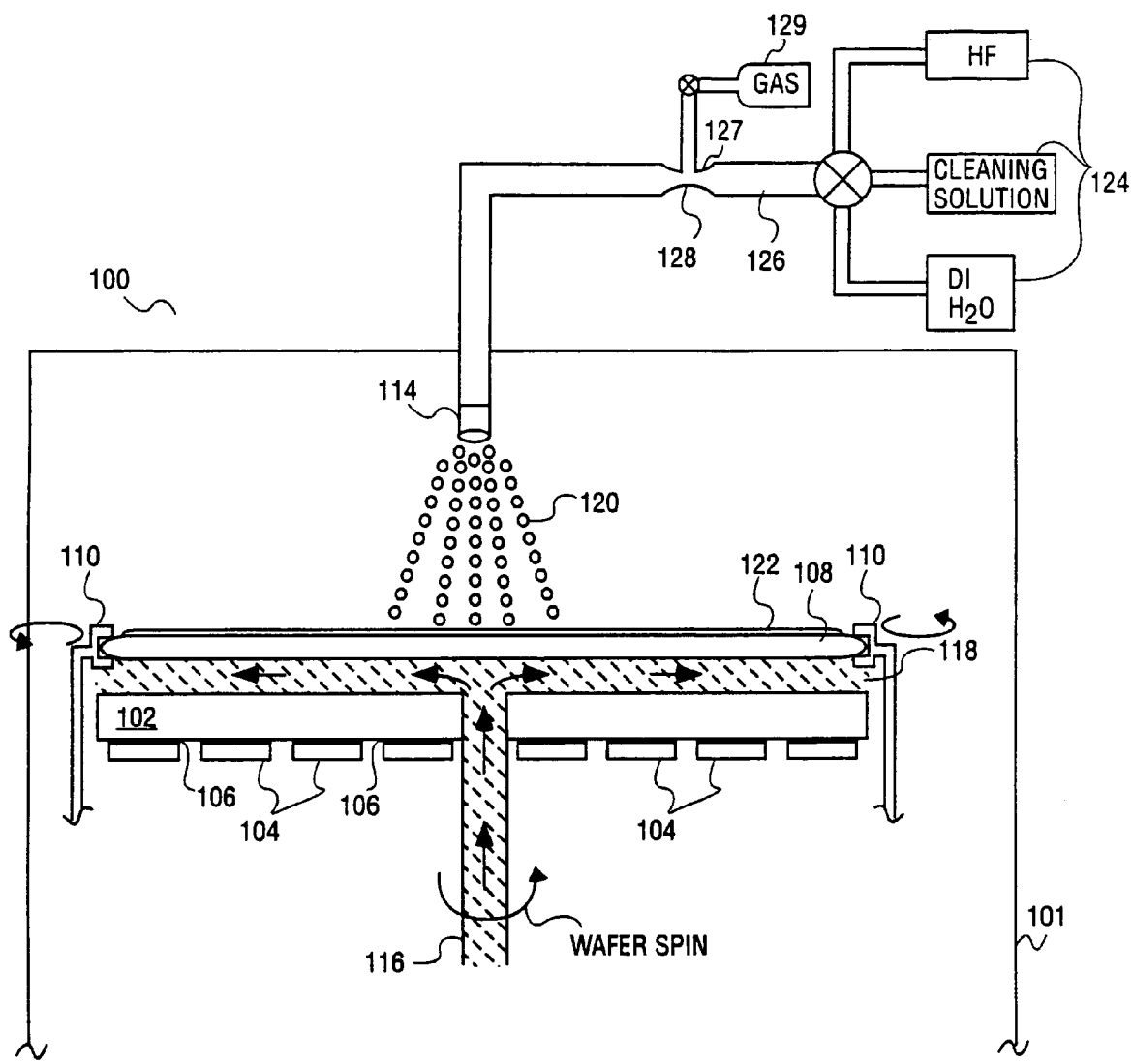
FIG. 1a is an illustration of a cross-sectional view of a single wafer cleaning apparatus having a venturi for dissolving a gas into a liquid processing fluid.

According to the present invention a venturi 128 is placed in a liquid supply conduit 126 before a opening such as spray or dispensing unit 114 located over a wafer support 110 which holds a wafer 108 to be processed as shown in FIG. 1a. In an embodiment of the present invention the venturi 128 is situated at or near the point of use (e.g., near spray nozzle 114). A venturi 128 is a throat or narrowing of the cross-sectional area of supply line 126. The venturi 128 creates under pressure locally because of the increase in flow rate of the liquid flowing through venturi 128 according to the Bernouilli principle. The use of a Bernouilli enables gases 129 to be dissolved into the flow of a processing liquid even when the supply gas is at a lower pressure than the processing liquid supply pressure. This provides added flexibility as to the supply of gas 129.

A gas 129 is dissolved into processing liquid through an opening 127 provided in conduit 126 of venturi 128. Because of the reduced pressure of venturi 128 gas can be easily dissolved into a liquid streaming past venturi 128.

The dissolved gas can be an inert gas such as but not limited to $N_2$, Ar, He, or a reactive gas such as $O_3$, $O_2$, and $H_2$. The gases can be dissolved in a wide variety of liquids used for wet processing such as but not limited to etching solutions such as HF and buffered HF, cleaning solutions such as SC-1 ($NH_4OH$, $H_2O_2$, and $H_2O$) and SC-2 (HCl, $H_2O_2$, and $H_2O$), and rinsing solutions such DI water. For example, $O_3$ can be dissolved into DI water to help rinse away chelating agents and surfactants used in cleaning solutions. Venturi 128 is ideal for dissolving $O_3$ into DI water because $O_3$ is typically supplied at lower pressures than the DI water is supplied into conduit 126. Additionally, inert gases such as He or $N_2$ can be dissolved into processing fluids in order to provide cavitation into a liquid film 122 formed on wafer 108 in order to improve the cleaning, etching, or rinsing of a wafer. The venturi 128 of the present invention is ideal for use in a single wafer processing apparatus such as apparatus 100 because it is a simple, quick, small, and cheap inline system for dissolving gas into a liquid. Additionally, venturi 128 can precisely control the amount of gas which is dissolved into a liquid.

Because ventui 128 can be used to precisely control the amount of gas dissolved into a fluid it enables a processing fluid to be generated which has the appropriate gas and with the appropriate concentration at the point of use for each process step. That is, according to an embodiment of the present invention first all gas is removed to the absolute minimum from the processing fluid such as DI water. The removal of the gas can be accomplished at for example, the central facilities where tanks 124 can be located. Once all gases have been sufficiently removed, a venturi 128 can be used to dissolve, at the point of use, the desired concentration of reactive and/or inert gases into the process liquid for every process step. This will dramatically improve the uniformity of the wet process. Once the desired amount of gas is dissolved in the desired processing liquid, the liquid can be sprayed or dispensed onto wafer 108 for etching, cleaning, or rinsing the wafer.

Figure 1B:
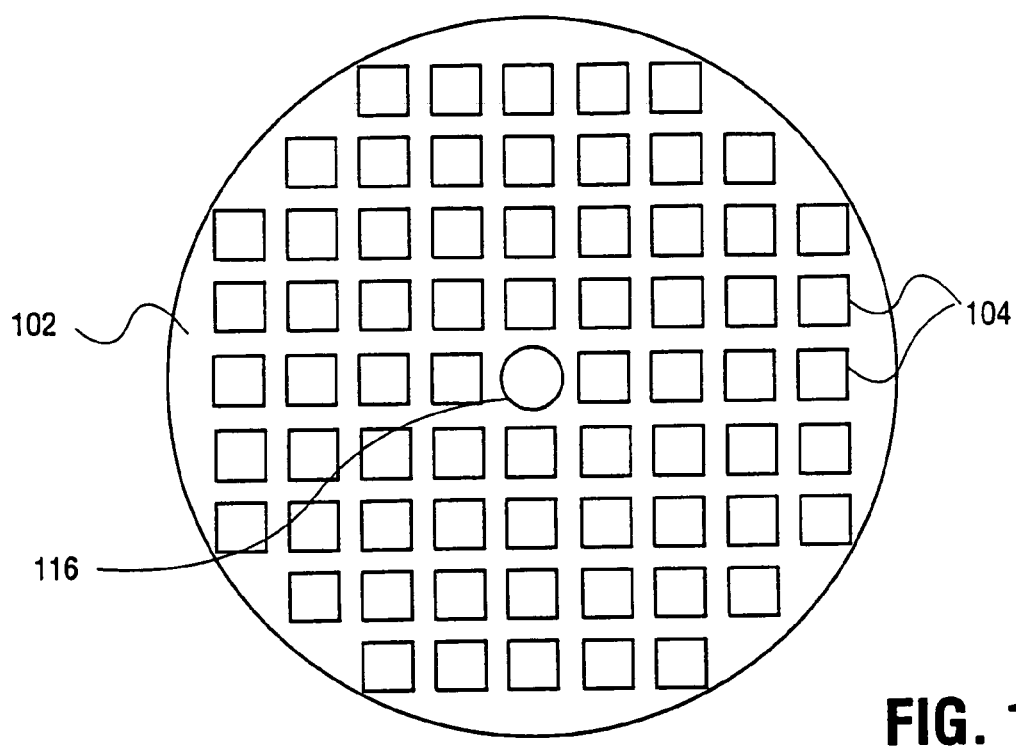
FIG. 1b is an illustration showing the covering of the entire surface area of a plate with transducers.

Although venturi 128 can be used in any wet processing apparatus requiring a dissolved gas, venturi 128 is ideal for use in a single wafer processing apparatus, such as apparatus 100 as shown in FIG. 1a. Single wafer cleaning apparatus 100 shown in FIG. 1a includes a plate 102 with a plurality of acoustic or sonic transducers 104 located thereon. Plate 102 is preferably made of aluminum but can be formed of other materials such as but not limited to stainless steel and sapphire. The plate is preferably coated with a corrosion resistant fluoropolymer such as Halar. The transducers 104 are attached to the bottom surface of plate 102 by an epoxy 106. The transducers 104 cover the entire bottom surface of plate 102 as shown in FIG. 1b. The transducers 100 preferably generate sonic waves in the frequency range between 400 kHz and 8 MHz. In an embodiment of the present invention the transducers are piezoelectric devices. The transducers 104 create acoustic or sonic waves in direction perpendicular to the surface of water 108.

Figure 1C:
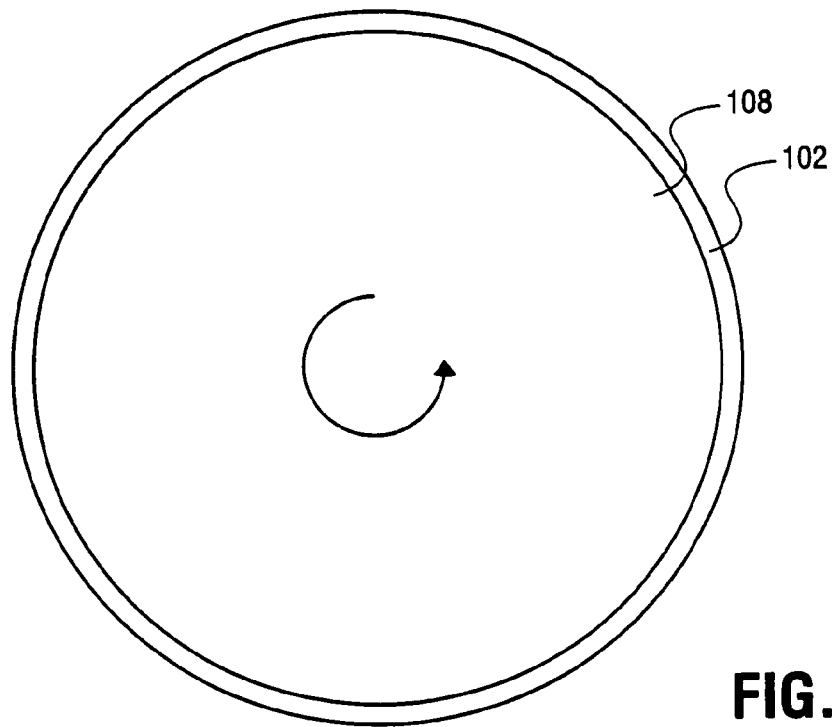
FIG. 1c is an illustration showing how the transducers covered plate of FIG. 1b covers the entire surface area of a wafer being cleaned.

A substrate or wafer 108 is held at distance of about 3 mm above the top surface of plate 102. The wafer 108 is clamped by a plurality of clamps 110 face up to a wafer support 112 which can rotate wafer 108 about at central axis. The wafer support can rotate or spin the wafer 108 about a central axis at a rate between 0–6000 rpm. In apparatus 100 only wafer support 112 and wafer 108 are rotated during use whereas plate 102 remains in a fixed position. Additionally, in apparatus 100 wafer 108 is place face up wherein the side of the wafer with patterns or features such as transistors faces towards a nozzle 114 for spraying cleaning chemicals thereon and the backside of the wafer faces plate 102. Additionally, as shown in FIG. 1c the transducer covered plate 102 has a substantially same shape as wafer 108 and covers the entire surface area of wafer 108. Apparatus 100 can include a sealable chamber 101 in which nozzle 114, wafer 108, and plate 102 are located.

During use, DI water (DI-$H_2O$) is fed through a feed through channel 116 and plate 102 and fills the gap between the backside of wafer 108 and plate 102 to provide a water filled gap 118 through which acoustic waves generated by transducers 104 can travel to substrate 108. In an embodiment of the present invention DI water fed between wafer 108 and plate 102 is degassed so that cavitation is reduced in the DI water filled gap 118 where the acoustic waves are strongest thereby reducing potential damage to wafer 108.

Additionally during use, cleaning chemicals and rinsing water such as DI-$H_2O$ are fed through a nozzle 114 to generate a spray 120 of dropless with form a thin liquid coating 122 (as little as 100 microns) on the top surface of wafer 108 while wafer 108 is spun. In the present invention tanks 124 containing etching, cleaning, and rinsing solutions such as diluted HF, de-ionized water (DI-$H_2O$), are coupled to conduit 126 which feeds nozzle 114.

We claim:

1. A method of processing a wafer:
   placing a wafer on a wafer support;
   flowing a liquid through a conduit having an output opening over said wafer support;
   dissolving a gas into said liquid prior to said output by flowing said gas into said conduit through a venturi opening formed in said conduit; and
   flowing said liquid with said dissolved gas through said output opening and onto said wafer.

2. The method of claim 1 wherein said gas is selected from the group consisting of $O_3$, $O_2$, $H_2$, $N_2$, Ar, and He.

3. The method of claim 1 wherein said liquid comprises HF.

4. The method of claim 1 wherein said liquid comprises DI water.

5. The method of claim 1 wherein said liquid comprising a cleaning solution.

6. The method of claim 1 further comprising degassing said liquid prior to flowing said liquid through said conduit.

7. The method of claim 1 wherein said gas is supplied at a lower pressure than said liquid flowing through said conduit.

8. The method of claim 7 wherein said gas is ozone ($O_3$).

9. The method of claim 1 further comprise applying acoustic waves to said wafer while flowing said liquid with said dissolved gas onto said wafer.

10. The method of claim 1, further comprising controlling the concentration of inert gases in the liquid to control the amount of cavitations on the wafer during a megasonic clean.

11. The method of claim 1, further comprising controlling the concentration of reactive gases in the liquid to control the reactions with contaminants on the surface of the wafer.

12. The method of claim 1, further comprising controlling the concentration of reactive gases in the liquid to control reactions with the wafer surface.

13. A method of processing a wafer comprising:
   placing a wafer on a support which positions said wafer horizontally above a plate having a plurality of acoustic transistors formed thereon, wherein said wafer is separated from said plate by a gap;
   flowing a liquid through a conduit having an output opening over said wafer;
   dissolving a gas into said liquid prior to said output by flowing said gas into said conduit through a venturi opening formed in said conduit;
   flowing said liquid with said dissolved gas through said opening and onto said wafer;
   flowing water into said gap between said wafer and said plate while generating acoustic waves with said transducers; and
   rotating said wafer while flowing said liquid with said dissolved gas onto said wafer and while flowing said water into said gap.

14. The method of claim 13 wherein said gas is selected from the group consisting of O3, O2, H2, N2, Ar and Ag.

15. The method of claim 13 wherein said liquid comprises HF.

16. The method of claim 13 wherein said liquid comprises DI water.

17. The method of claim 13 further comprising degassing said liquid prior to flowing said liquid through said conduit.

18. The method of claim 13 wherein said gas is supplied at a lower pressure than said liquid flowing through said conduit.

19. A method of wet processing a wafer comprising:
placing a wafer on a wafer support;
flowing a liquid through a conduit having an output opening above said wafer;
dissolving a gas in said liquid while said liquid flows through said conduit;
wherein said conduit has an input portion and an output portion with a first cross-sectional area and a narrowed portion with a second cross-sectional area which is less than said first cross-sectional area, and flowing said gas into said liquid through an opening formed in said narrowed portion of said conduit to dissolve said gas into said liquid; and
flowing said liquid with said dissolved gas through said output opening and onto said wafer, of said wet processing method.

20. The method of claim 19, wherein the pressure of the liquid flowing in the conduit having the first cross-sectional area is higher than the gas pressure at said opening formed in the narrow portion of the conduit.

21. The method of claim 19, further comprising controlling the concentration of inert gases in the liquid to control the amount of cavitations on the wafer during a megasonic clean.

22. The method of claim 19, further comprising controlling the concentration of reactive gases in the liquid to control the reactions with contaminants on the surface of the wafer and/or to control the reactions with the wafer surface.

* * * * *